United States Patent
Honda et al.

(10) Patent No.: US 7,855,245 B2
(45) Date of Patent: Dec. 21, 2010

(54) ADHESIVE COMPOSITION AND A METHOD OF USING THE SAME

(75) Inventors: Tsuyoshi Honda, Annaka (JP); Tatsuya Kanemaru, Karuizawa-machi (JP); Shinsuke Yamaguchi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 414 days.

(21) Appl. No.: 12/149,032

(22) Filed: Apr. 25, 2008

(65) Prior Publication Data

US 2008/0268255 A1 Oct. 30, 2008

(30) Foreign Application Priority Data

Apr. 27, 2007 (JP) .............................. 2007-118829

(51) Int. Cl.
    *C08K 5/06* (2006.01)
    *C08K 5/3445* (2006.01)
    *B32B 27/38* (2006.01)
    *B32B 37/02* (2006.01)
    *B32B 37/12* (2006.01)
    *C08G 59/00* (2006.01)

(52) U.S. Cl. ................. 524/106; 524/376; 428/413; 525/523; 156/256

(58) Field of Classification Search .............. 524/106, 524/376; 428/413; 525/523; 156/256
    See application file for complete search history.

(56) References Cited

U.S. PATENT DOCUMENTS 5,258,456 A * 11/1993 Ochi et al. ................. 525/90
6,512,031 B1 * 1/2003 Honda et al. ............... 524/115

FOREIGN PATENT DOCUMENTS

JP 6-333963 12/1994

* cited by examiner

*Primary Examiner*—Kriellion A Sanders
(74) *Attorney, Agent, or Firm*—Birch, Stewart, Kolasch & Birch, LLP

(57) ABSTRACT

An adhesive composition comprising
100 parts by weight of (A) an alternating copolymer composed of repeating units having alcoholic hydroxyl groups and represented by the following formula (1):

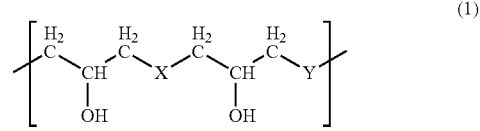

10 to 1,000 parts by weight of (B) an epoxy resin having at least two glycidyl groups per molecule, and
0.1 to 10 parts by weight of (C) a curing promoter. The composition is particularly suitable as a die bonding agent.

9 Claims, 1 Drawing Sheet

ADHESIVE COMPOSITION AND A METHOD OF USING THE SAME

CROSS REFERENCE

This application claims benefit of Japanese Patent application No. 2007-118829 filed on Apr. 27, 2007, the contents of which are hereby incorporated by reference.

FIELD OF THE INVENTION

The present invention relates to an adhesive composition comprising an epoxy resin, specifically to an adhesive composition which gives cured product containing soft segments derived from alcoholic hydroxyl groups. The composition is suitable for a die bonding agent to bond a ship to a substrate or other chip.

BACKGROUND OF THE INVENTION

Semiconductor devices are prepared by dicing a large-diameter silicon wafer with IC circuits formed thereon into chips, thermocompression bonding a chip to a lead frame via a liquid adhesive called die bonding agent, wire bonding between electrodes of the chip and the lead frame, and encapsulating thus obtained device to protect the chip. For encapsulating the device, resin transfer molding is most commonly used because of its mass productivity and low production costs.

To downsize and diversify electric and electrical appliances, packaging technology in which no lead frame is becoming common, for example, area array packaging such as Chip Scale Package (CSP), Stacked Chip Scale Package, System in Package (SiP). Devices in these packagings are required to have higher resistance to thermal shock than before.

In addition, higher reflow temperature of 265° C. is required for lead-free solder. Among materials used for the packagings, a die bonding agent is considered to allow wider modification than others. For this reason, a die bonding agent is required which meets the requirement of the resistance to thermal shock.

Japanese Patent Application Laid-Open No. H06-333963 describes adding to a die bonding agent a flexibilizer such as a reaction product of a modified silicone oil having hydroxylphenyl groups and an epoxy resin. It is described that the use of the flexibilizer in combination with an imidazole derivative provides a cured product which has no void and is resistant to thermal shock.

SUMMARY OF THE INVENTION

It is a well-known means to utilize flexibility of a silicone as in the aforesaid flexibilizer. However, materials to be used in combination with silicones are limited due to relatively low compatibility of silicones. In addition, there are some applications for which non-silicone material is desirable.

An object of the present invention is therefore to provide a non-silicone adhesive which is reactive with an epoxy resin to give a cured product resistant to thermal shock.

The present invention is an adhesive composition comprising 100 parts by weight of (A) an alternating copolymer composed of repeating units having alcoholic hydroxyl groups and represented by the following formula (1):

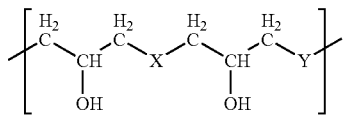

wherein X is at least one organic divalent group selected from the following groups, and

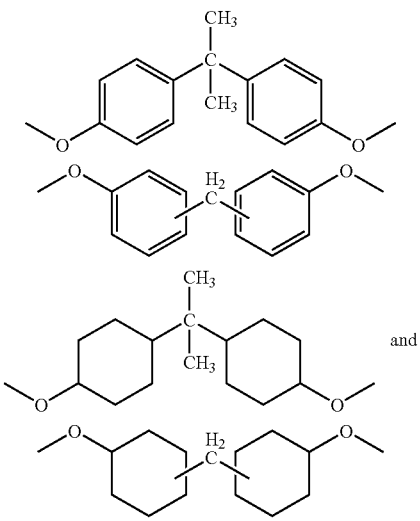

Y is at least one organic divalent group selected from the following groups,

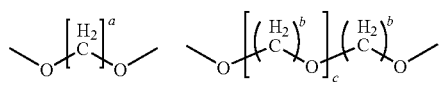

wherein a is an integer of from 1 to 100, b is an integer of from 1 to 6, and c is an integer of from 1 to 40, and

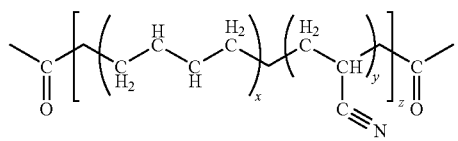

wherein x, y and z are integers of 0 or greater with [y/(x+y)] ranging from 0 to 0.3 and (xz+yz) ranging from 30 to 100, 10 to 1,000 parts by weight of (B) an epoxy resin having at least two glycidyl groups per molecule, and 0.1 to 10 parts by weight of (C) a curing promoter.

The alcoholic hydroxyl group of the component (A) reacts with the epoxy resin (B) to form a flexible and thermal shock resistant cured product. The present composition is therefore very suitable as a die bonding agent to fix a chip on a substrate or another chip.

Figure 1:
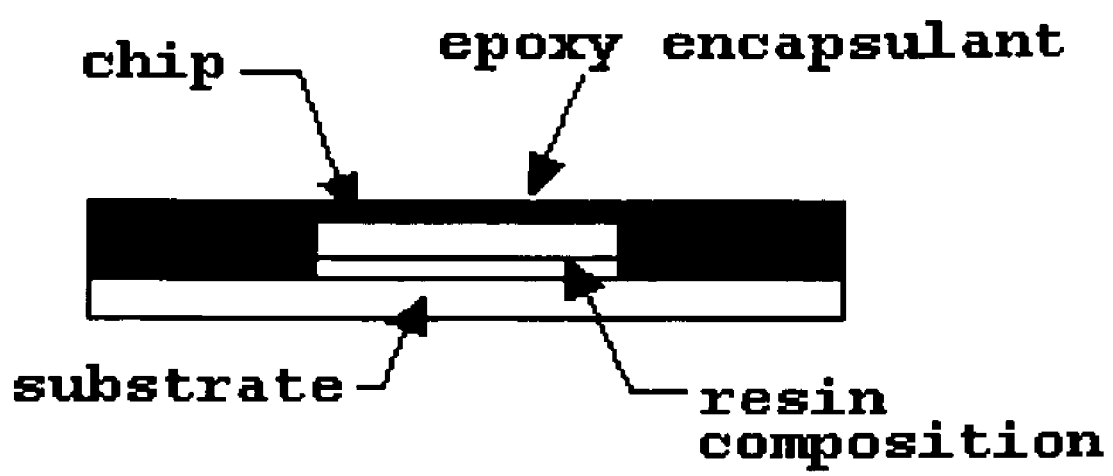
FIG. 1 is a cross-sectional view of a semiconductor device prepared in Example.

PREFERRED EMBODIMENTS OF THE INVENTION (A) Alternating Copolymer Having Alcoholic Hydroxyl Group The alternating copolymer having X and Y moieties alternatingly has a secondary alcoholic hydroxyl group having methylene groups at both β-positions.

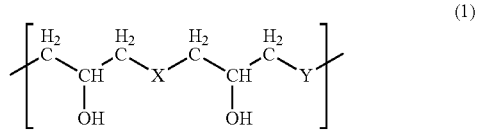

(1)

Generally, an alcoholic hydroxyl group is not so reactive with an epoxy resin. However, because of small steric hindrance, the aforesaid alcoholic hydroxyl group shows high reactivity particularly when after mentioned imidazole derivative is used as a curing promoter. A cured product is more flexible than the one obtained from a phenolic curing agent.

In the formula (1), X is at least one divalent group selected from the following groups.

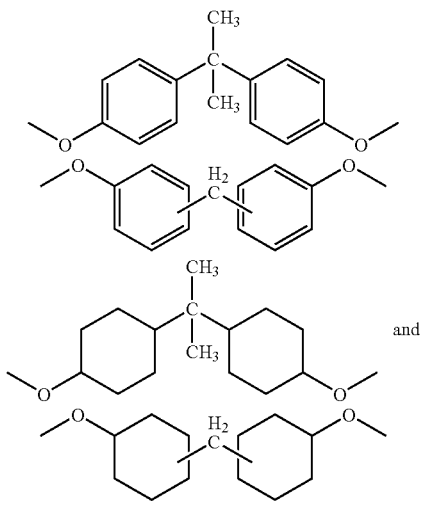

and

Y is at least one divalent group selected from the following groups.

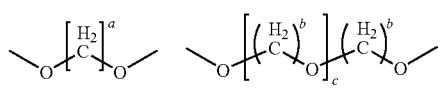

In the above formulas, a is an integer of from 1 to 100, preferably from 4 to 100, b is an integer of from 1 to 6, preferably from 2 to 6, and c is an integer of from 1 to 40, preferably from 1 to 30.

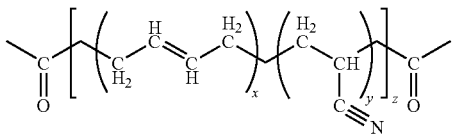

In the above formula, x, y and z are integers of 0 or greater with [y/(x+y)] ranging from 0 to 0.3, preferably from 0.1 to 0.2, and (xz+yz) ranging from 30 to 100. Preferably, z ranges from 10 to 20.

A phenoxy resin is known to have an alcoholic hydroxyl group. Compared with the phenoxy resin, the present alternating copolymer (A) gives more flexible and comparatively heat resistant cured product for the reason that the copolymer (A) has the soft segment Y selected from alkylene, ether, and butadiene/nitrile moieties in addition to the hard segment X selected from bisphenol and hydrogenated bisphenol moieties.

The alternating copolymer (A) can be prepared by reacting an aromatic or alicyclic compound to derive X with a linear compound to derive Y. By selecting types, molecular weight, and contents of the hard and the soft segments, a cured product having flexibility suitable for its application can be obtained.

Preferably, the alternating copolymer (A) has a weight average molecular weight reduced to polystyrene of from 5,000 to 150,000. With a copolymer having a molecular weigh smaller than the aforesaid lower limit, a cured product which is resistant to thermal-shock may not be obtained. Moreover, a composition containing such a low-molecular weight copolymer may stick to a dicer used in a dicing process due to a low viscosity. On the other hand, a copolymer having a molecular weight higher than the aforesaid upper limit may have undesirably low miscibility with an epoxy resin. Moreover, a composition containing such a high-molecular weight copolymer may not adhere to a substrate due to high viscosity after a diluent, if contained, evaporates.

The alternating copolymer (A) has a glass transition temperature of from 0 to 90° C., preferably from 0 to 60° C. The glass transition temperature can be attained by selecting type and contents of raw materials, molecular weight, and conditions of synthesis of the polymer. Particularly, a balance of contents between the hard segment and the soft segment is important. Glass transition temperature increases with the hard segment content, and decreases with the soft segment content. Glass transition temperature can be determined by thermal analysis such as Differential Scanning Calorimety (DSC). A composition comprising a copolymer having a glass transition temperature lower than the aforesaid lower limit may be too soft to bond a chip to a substrate or other chip firmly even after a diluent is removed from the composition. On the other hand, a copolymer having a glass transition temperature above the aforesaid upper limit does not have desired softness.

(B) Epoxy Resin

The epoxy resin having at least two glycidyl groups per molecule is preferably selected from the group consisting of bisphenol A type epoxy resins, bisphenol F type epoxy resins, and cresol novolac epoxy resins of the following formula (2).

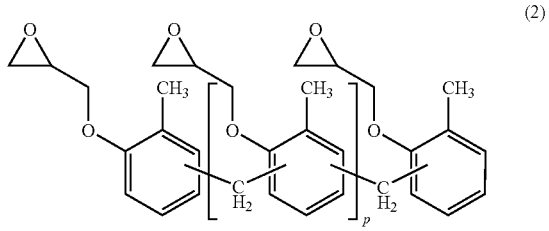

(2)

wherein p is an integer of from 1 to 8.

The glycidyl groups of the epoxy resin (B) react with the alcoholic hydroxyl groups of the component (A) to form cross-linkages. The component (B) increases adhesion strength of the composition to a substrate or another chip. That is, when the composition is heated in a die bonding process, the softened epoxy resin (B) exudes from a matrix of the component (A) and wets the substrate or the chip, whereby increasing the adhesion strength of the composition.

The epoxy resin (B) is contained in the composition in an amount of from 10 to 1,000 parts by weight, preferably from 20 to 500 parts by weight per 100 parts by weight of the component (A). If it is contained less than the aforesaid lower limit, satisfactory degree of cross linking or adhesion strength may not be attained.

(C) Curing Promoter

The curing promoter (C) is to promote reaction between the hydroxyl groups of the component (A) and the glycidyl groups of the component (B). Examples of the curing promoter include dicyanodiamide and imidazole derivatives. Preferably, an imidazole derivative represented by the following formula (5):

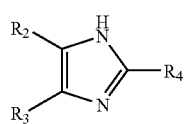

(5)

wherein $R^2$, $R^3$, and $R^4$ are each an organic group having 1 to 10 carbon atoms.

Preferably, 2-phenyl-4-hydroxylmethylimidazole of the following formula (6) and/or 2-phenyl-4,5-dihydroxylmethylimidazole of the formula (7) is used.

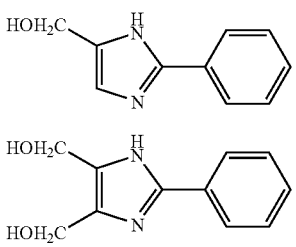

(6)

(7)

When the composition is used according to the after mentioned method, it contains a diluent. The aforesaid 2-phenyl-4-hydroxylmethylimidazole and 2-phenyl-4,5-dihydroxylmethylimidazole are insoluble in most diluents, which makes the composition storage stable. The promoters are not active until they are heated at a temperature of about 200° C. but, once activated, they strongly catalyze the reaction between hydroxyl groups of the component (A) and glycidyl groups of the component (B). This allows wide process latitude of heating temperature or time for evaporating a diluent and storage stability of the composition in solid state. Moreover, cured products have high degree of cross linking.

The curing promoter (C) is incorporated in the composition in an amount of from 0.1 to 10 parts by weight, preferably from 0.2 to 1 part by weight, per 100 parts by weight of the component (A). With the curing promoter in an amount less than the aforesaid lower limit, cross linking reaction may not proceed sufficiently. The curing promoter in an amount more than the aforesaid upper limit may degrade storage stability.

(D) Diluent

To apply the present composition easily to an object, one may incorporate a diluent in the present composition. Preferably, the diluent is a good solvent for the alternating copolymer (A), and the epoxy rein (B) and an optional epoxy resin curing agent while it is a poor solvent for the curing promoter (C). Examples of the diluent include aromatic hydrocarbons such as toluene, xylene; ketones such as methyl isobutyl ketone, cyclohexanone, isophorone, and diacetone alcohol; ethers such as methyl cellosolve, ethyl cellosolve, butyl cellosolve, methyl carbitol, ethyl carbitol, butyl carbitol; glycol acetate such as Methyl Cellosolve acetate, Ethyl Cellosolve acetate, Butyl Cellosolve acetate and carbitol acetate. Preferred are isophorone, methyl carbitol, ethyl carbitol, butyl carbitol and carbitol acetate for the reasons that they have boiling points of from 180 to 230° C. and make the composition easy to handle.

Content of the diluent can be adjusted according to an intended use of the composition. Typically, the content ranges from 10 to 90 parts by weight per 100 parts by weight of the composition. If it exceeds the aforesaid upper limit, after mentioned inorganic filler, if contained, may settle during long-term storage of the composition.

Curing Agent for an Epoxy Resin

The present composition may contain a curing agent for an epoxy resin in an amount not to adversely affect the composition. Examples of the curing agent include phenolic resins, acid anhydrides, and aromatic amines, among which phenolic resins are preferred, and more preferably those represented by the following formulas (8) to (10).

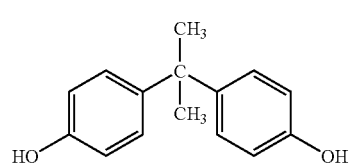

(8)

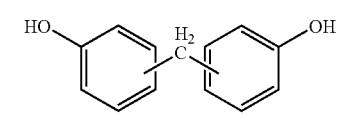

(9)

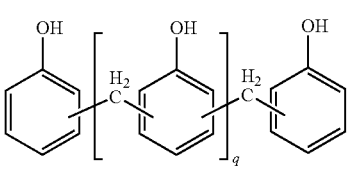

(10)

wherein q is an integer of 0 or larger, preferably from 1 to 8.

The curing agent is contained preferably in such an amount that an equivalent ratio of the curing agent to the component (B) ranges from 0.8 to 1.2.

Other Components

In addition to the aforesaid components, the present composition may contain commonly used additives. Examples of the additives include inorganic fillers, for example, electrically conductive powder such as silver powder, and electrically insulating powder such as silica and alumina, adhesion promoter such as alkoxysilane, flame retardants, and ion trapping agents. Inorganic filler commonly used for an epoxy composition can be used which decreases expansion coefficient of cured epoxy whereby reducing stress placed on a semiconductor element. Examples of the inorganic filler include silica filler such as crushed or spherical fused silica and crystalline silica, alumina, silicon nitride, and aluminum nitride. To decrease expansion coefficient and high packing density, spherical filler or a mixture of spherical and crushed fillers is preferred. The inorganic filler is preferably pretreated with a silane coupling agent.

Method of Preparing the Composition

The present composition can be prepared by any known mixing means such as a mixer and roller. Sequence, time, temperature, and pressure of the mixing can be adjusted as needed.

Method of Using the Composition

The present composition can be used according to a method comprising the following steps (1) to (4) or a method comprising the following steps (i) to (v).

The first method comprises the steps of (1) applying the adhesive composition on a substrate,
(2) heating the applied composition to remove the diluent (D), whereby forming an adhesive layer,
(3) placing a chip on the applied composition, and
(4) curing the composition.

The second method comprises the steps of (i) applying the composition on a back side of a wafer,
(ii) heating the applied composition to form an adhesive layer by removing the diluent (D),
(iii) fixing the wafer on a dicer via the adhesive layer followed by dicing the wafer into a plurality of chips,
(iv) picking up one of the chip provided with the adhesive layer bonded on its back side followed by bonding the chip to a substrate or another chip via the adhesive layer, and
(v) curing the adhesive layer.

In the steps (1) and (i), the composition is applied on the substrate or the wafer by a dispenser, printer or spin coater. In the steps (2) and (ii), the composition is heated in a batch or continuous oven to remove the diluent, whereby the composition loses fluidity. In the steps (3) and (iv), chips are bonded with a die bonder. In the steps (4) and (v), the composition cured in a batch or continuous oven. In the second method, the wafer and the composition applied to the back side the wafer are cut by a dicer.

The composition may be applied on a wafer in the form of a film which comprises a base film and an adhesive layer made of the composition provided on the base film. After the film is applied to the wafer, the base film is peeled off.

Applications of the Composition

The present composition is particularly suitable for preparing a semiconductor device, but it is also suitable for applications where soft, thermal-shock resistant, and storage stable adhesive or sealant is required.

EXAMPLES

The present invention will be explained with reference to the following Examples but not be limited thereto.

(I) Materials Used

Polymer A (Preparation Example 1)
Polymer B (Preparation Example 2)
Polymer C (Preparation Example 3)
Polymer D (Preparation Example 4)

Epoxy resin: Bisphenol A type epoxy resin having an epoxy equivalent of 180, RE310S, ex Nihon Kayaku Co., Ltd.

Curing promoter: 2-phenyl-4,5-dihydroxylmethylimidazole, 2PHZ, ex Shikoku Chemicals Co.

Phenolic resin: Phenol novolac epoxy resin having an epoxy equivalent of 110, DL-92, ex Meiwa Chemicals Co.

Silica: Spherical fused silica having an average particle size of 0.8 μm and a maximum particle size of 3 μm, SE2030, ex Admatechs Co., Ltd.

Adhesive aid: γ-glycidoxypropyltrimethoxysilane, KBM-403, ex Shin-Etsu Chemical Co., Ltd.

Diluent: Carbitol acetate

Resin Used in Comparative Examples

Polymer E: Phenoxy resin represented by the following formula (11) having a weight average molecular weight of 51,000 and a glass transition temperature of 98° C., YL1256, ex Japan Epoxy Resin Co.

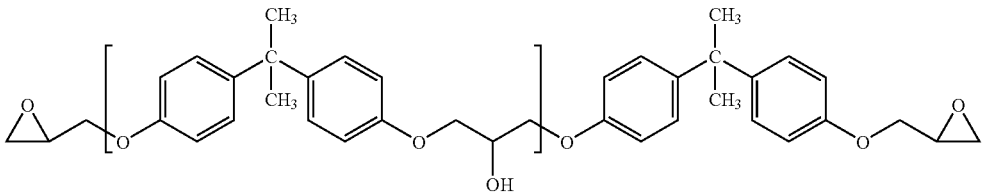

(11)

(An average number of repeating units being 26)

(II) Preparation of Alternating Copolymer having Alcoholic Hydroxyl Groups

Preparation Example 1

Polymer A

In a flask equipped with a stirring blade, a thermometer, and a reflux condenser, were placed 15.0 g (0.1 mol) of an epoxy resin of the following formula (12) (W-100, ex New Japan Chemical co., ltd.), 11.4 g (0.1 mol) of Bisphenol A, 0.262 g (0.001 mol) of triphenylphosphine (TPP, ex Hokko Chemical Industry Co., LTD.) and 106.6 g of toluene and subjected to reaction at 100° C. under nitrogen atmosphere.

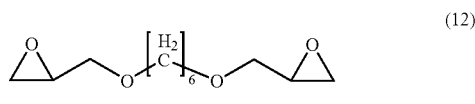

(12)

Progress of the reaction was monitored by measuring epoxy equivalent. When the epoxy equivalent reached in the range of from 10,000 and 25,000, which took about 6 to 8 hours, the heating was stopped. After cooled to room temperature, the reaction mixture was transferred to a separatory funnel and washed with 1066 g of deionized water for 2 hours. The separatory funnel was allowed to stand for 2 hours and a portion of the upper layer, i.e., toluene layer, was sampled for phosphorous analysis. When a phosphorous content fell to 10 ppm or lower, based on a solid content, after 3 to 5 times of washing, the toluene layer was isolated. By evaporating toluene from the toluene layer, a transparent colorless solid having a glass transition temperature of 20° C. was obtained.

Preparation Example 2

Polymer B

In a flask equipped with a stirring blade, a thermometer, and a reflux condenser, were placed 43.0 g (0.1 mol) of an epoxy resin of the following formula (13) (YL7217, ex Japan Epoxy Resin Co.), 11.4 g (0.1 mol) of Bisphenol A, 0.262 g (0.001 mol) of triphenylphosphine (TPP, ex Hokko Chemical Industry Co., LTD.) and 218.6 g of toluene and subjected to reaction at 100° C. under nitrogen atmosphere.

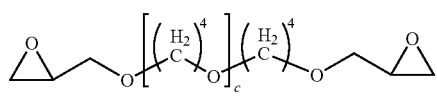

(13)

(c being 8.5 on average)

Progress of the reaction was monitored by measuring epoxy equivalent. When the epoxy equivalent reached in the range of from 10,000 and 25,000, the heating was stopped. After cooled to room temperature, the reaction mixture was transferred to a separatory funnel and washed with 2186 g of deionized water in the same manner as in Preparation Example 1. A transparent colorless solid having a glass transition temperature of 5° C. was obtained.

Preparation Example 3

Polymer C

In a flask equipped with a stirring blade, a thermometer, and a reflux condenser, were placed 18.0 g (0.10 mol) of Bisphenol A type epoxy resin (RE310S, ex Nihon Kayaku Co., Ltd.), 238.8 g (0.1 mol) of liquid butadiene rubber of the following formula (14) (CTB2000*162, ex Ube Industries Ltd.) and 1027.2 g of xylene and subjected to reaction at 120° C. under nitrogen atmosphere.

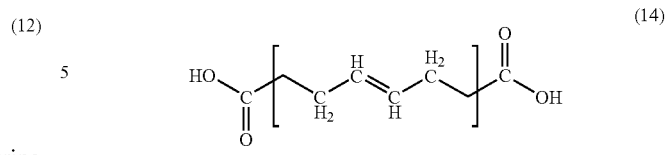

(14)

(Average number of repeating units is 150)

Progress of the reaction was monitored by measuring epoxy equivalent. When the epoxy equivalent reached in the range of from 10,000 and 25,000, which took about 12 to 16 hours, the heating was stopped. By removing xylene, transparent yellow solid having a glass transition temperature of 18° C. was obtained.

Preparation Example 4

Polymer D

In a flask equipped with a stirring blade, a thermometer, and a reflux condenser, were placed 18.0 g (0.10 mol) of Bisphenol A type epoxy resin (RE310S, ex Nihon Kayaku Co., Ltd.), 189.2 g (0.1 mol) of liquid butadiene rubber of the following formula (15) (CTB1300*8, ex Ube Industries Ltd.) and 828.8 g of xylene and subjected to reaction at 120° C. under nitrogen atmosphere.

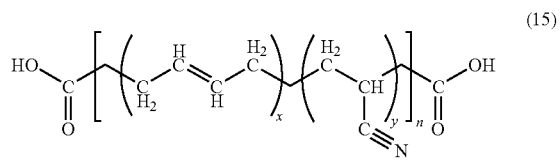

(15)

($y/(x+y)=0.17$, n is 15 on average)

Progress of the reaction was monitored by measuring epoxy equivalent. When the epoxy equivalent reached in the range of from 10,000 and 25,000 the heating was stopped. By removing xylene, transparent brown solid having a glass transition temperature of 48° C. was obtained.

(III) Preparation of Composition

Compositions were prepared by mixing components as shown in Tables 1 and 2 with a planetary mixer at 25° C. The mixture obtained was passed through a three roller mill at 25° C. and then mixed again with the planetary mixer at 25° C. The compositions prepared were evaluated according to the following methods (a) to (c). Results are as shown in Table 1 and 2.

(IV) Test Methods (a) Young's Modulus of Cured Composition

A composition was cured by heating at 120° C. for 1 hour and then 165° C. for 2 hours. Young's modulus of the cured composition was measured at −55° C., 25° C., and 125° C. by Dynamic Mechanical Analysis (DMA).

(b) Resistance to Humidity and Reflow (1) Twenty pieces of test device as shown in FIG. 1 were prepared in the following manner.

(i) Application of a Composition to a Wafer

On one side of a 0.3 mm thick silicone wafer having a diameter of 8 in., 2 g of a composition was placed. Using a spin coater, a thin layer of the composition was formed in the following sequence of a spinning rate: from 0 to 1,500 rpm in 10 seconds, at 1,500 rpm for 30 seconds, from 1,500 to 3,000 rpm in 10 seconds, at 3,000 rpm for 30 seconds, and from 3,000 to 0 rpm in 10 seconds. The layer of the composition having a thickness of from 30 to 50 μm thus obtained was dried at 120° C. for 1 hour under nitrogen flow, whereby the wafer having the layer of the composition was obtained.

(ii) Dicing of a Wafer and Mounting of a Chip

To the layer of the composition, a commercially available dicing film was stuck and then the wafer was diced in 12 mm×12 mm chips. A chip having the layer of the composition at its back side was picked up and bonded via the layer of the composition to a 35 mm×35 mm×200 μm BT substrate coated with 20 μm thick solder resist layer in the following bonding conditions: chip temperature of 150° C., substrate temperature of 100° C., and load of 1 kg for 0.1 second. Then, the device obtained was heated at 165° C. for 2 hours in nitrogen atmosphere to cure the composition.

(iii) Resin Encapsulation

The device obtained in step (ii) was encapsulated with an epoxy encapsulant, KMC-2520, ex Shin-Etsu Chemical Co., Ltd., in the following molding conditions: a metal mold temperature of 175° C., injection time of 10 seconds, injection pressure of 70 kPa, molding time of 90 seconds. The encapsulated device was post cured at 180° C. for 2 hours. The test device thus prepared measured 35 mm×35 mm×1,000 μm.

(2) Twenty pieces of test device thus prepared were left stand at 85° C. and at 85% RH in a thermo-hygrostat for 168 hours. Then, they were passed through an IR reflow with maximum temperature of 260° C. three times. Then, the test devices were observed with an ultrasonic image observation instrument to detect occurrence of defects, for example, a crack, and the number of test device per 20 test devices showing a defect was counted.

(c) Thermal Cycle Test

Test devices were subjected to a thermal cycle test. Temperature profile of one thermal cycle is as follows: −55° C. for 30 minutes, −55° C. to 125° C. in 5 minutes, 125° C. for 30 minutes, and 125° C. to −55° C. in 5 minutes.

After 500 cycles and 1000 cycles, respectively, the devices were observed in the same manner as in the test (b).

TABLE 1

| | | Ex. 1*[1] | Ex. 2 | Ex. 3 | Ex. 4 | Ex. 5 |
|---|---|---|---|---|---|---|
| Polymer A | | 100 | 0 | 0 | 0 | 100 |
| Polymer B | | 0 | 100 | 0 | 0 | 0 |
| Polymer C | | 0 | 0 | 100 | 0 | 0 |
| Polymer D | | 0 | 0 | 0 | 100 | 0 |
| Polymer E | | 0 | 0 | 0 | 0 | 0 |
| Epoxy resin | | 25 | 25 | 25 | 25 | 10 |
| Curing promoter | | 0.5 | 0.5 | 0.5 | 0.5 | 0.5 |
| Phenolic resin | | 0 | 0 | 0 | 0 | 0 |
| Silica | | 126 | 126 | 126 | 126 | 111 |
| Adhesion aid | | 0.5 | 0.5 | 0.5 | 0.5 | 0.5 |
| Diluent | | 252 | 252 | 252 | 252 | 222 |
| (a) Young's modulus [MPa] | −55° C. | 2900 | 2400 | 2800 | 3500 | 2200 |
| | 25° C. | 35 | 28 | 32 | 86 | 18 |
| | 125° C. | 25 | 21 | 18 | 24 | 9 |
| (b) Resistance to humidity and reflow | | 0/20 | 0/20 | 0/20 | 0/20 | 0/20 |
| (c) Thermal cycle test | 500 cycles | 0/20 | 0/20 | 0/20 | 0/20 | 0/20 |
| | 1000 cycles | 0/20 | 0/20 | 0/20 | 0/20 | 0/20 |

*[1]"Ex." stands for Example.

TABLE 2

| | | Ex. 6 | Ex. 7 | Ex. 8 | Comp. Ex. 1*[2] | Comp. Ex. 2 |
|---|---|---|---|---|---|---|
| Polymer A | | 100 | 0 | 100 | 0 | 0 |
| Polymer B | | 0 | 0 | 0 | 0 | 0 |
| Polymer C | | 0 | 0 | 0 | 0 | 0 |
| Polymer D | | 0 | 100 | 0 | 0 | 0 |
| Polymer E | | 0 | 0 | 0 | 100 | 100 |
| Epoxy resin | | 62.1 | 62.1 | 186.2 | 25 | 62.1 |
| Curing promoter | | 0.5 | 0.5 | 0.5 | 0.5 | 0.5 |
| Phenolic resin | | 37.9 | 37.9 | 113.8 | 0 | 37.9 |
| Silica | | 201 | 201 | 401 | 126 | 201 |
| Adhesion aid | | 0.5 | 0.5 | 0.5 | 0.5 | 0.5 |
| Diluent | | 402 | 402 | 802 | 252 | 402 |
| (a) Young's modulus [MPa] | −55° C. | 3200 | 3800 | 3400 | 5400 | 6200 |
| | 25° C. | 240 | 350 | 720 | 2400 | 3800 |
| | 125° C. | 54 | 86 | 120 | 54 | 230 |
| (b) Resistance to humidity and reflow | | 0/20 | 0/20 | 0/20 | 1/20 | 2/20 |
| (c) Thermal cycle test | 500 cycles | 0/20 | 0/20 | 0/20 | 5/20 | 18/20 |
| | 1000 cycles | 0/20 | 0/20 | 0/20 | 15/20 | 20/20 |

*[2]"Comp.Ex." stands for Comparative Example.

As shown in Tables 1 and 2, the compositions of Examples comprising the alternating copolymers having alcoholic hydroxyl groups gave cures products which have smaller Young's modulus to be more resistant to thermal shock than those of Comparative Examples. The present adhesive composition is thus suitable for producing highly reliable semiconductor devices.

The invention claimed is:

1. An adhesive composition comprising
100 parts by weight of (A) an alternating copolymer composed of repeating units having alcoholic hydroxyl groups and represented by the following formula (1):

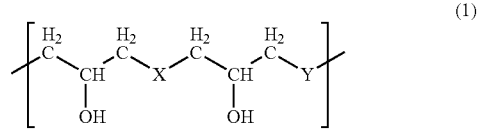

wherein X is at least one organic divalent group selected from the following groups, and

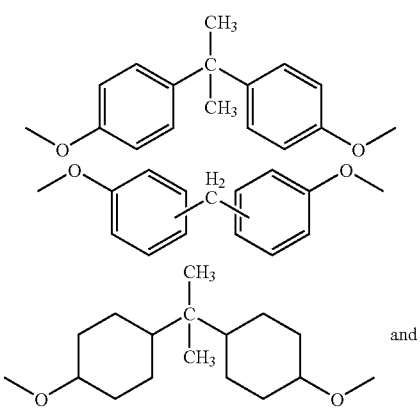

-continued

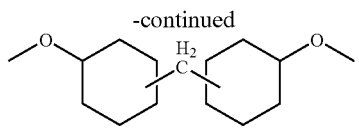

Y is at least one organic divalent group selected from the following groups,

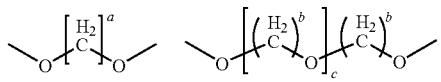

wherein a is an integer of from 1 to 100, b is an integer of from 1 to 6, and c is an integer of from 1 to 40, and

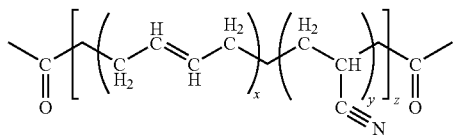

wherein x, y and z are integers of 0 or greater with [y/(x+y)] ranging from 0 to 0.3 and (xz+yz) ranging from 30 to 100, 10 to 1,000 parts by weight of (B) an epoxy resin having at least two glycidyl groups per molecule, and 0.1 to 10 parts by weight of (C) a curing promoter.

2. The adhesive composition according to claim 1, wherein the alternating copolymer (A) has a glass transition temperature, determined by differential scanning calorimetry, of from 0 to 60° C.

3. The adhesive composition according to claim 1, wherein the epoxy resin (B) is selected from the group consisting of bisphenol A epoxy resins, bisphenol F epoxy resins, and cresol novolac epoxy resins represented by the following formula (2):

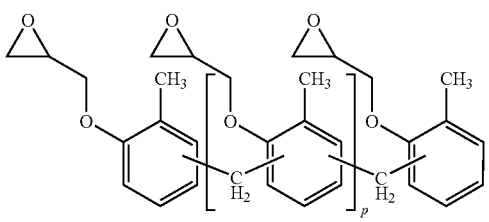

(2)

wherein p is an integer of from 1 to 8.

4. The adhesive composition according to claim 1, wherein the curing promoter (C) is an imidazole derivative represented by the following formula (5):

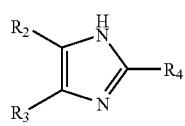

(5)

wherein $R^2$, $R^3$, and $R^4$ are each an organic group having 1 to 10 carbon atoms.

5. The adhesive composition according to claim 4, wherein the curing promoter (C) is 2-phenyl-4-hydroxylmethylimidazole or 2-phenyl-4,5-dihydroxylmethylimidazole.

6. The adhesive composition according to claim 1, wherein the composition further comprises (D) a diluent selected from the group consisting of isophorone, methyl carbitol, ethyl carbitol, butyl carbitol and carbitol acetate.

7. A semiconductor device comprising a cured adhesion composition, wherein said adhesion composition comprises 100 parts by weight of (A) an alternating copolymer composed of repeating units having alcoholic hydroxyl groups and represented by the following formula (1):

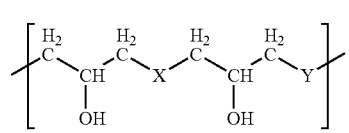

(1)

wherein X is at least one organic divalent group selected from the following groups, and

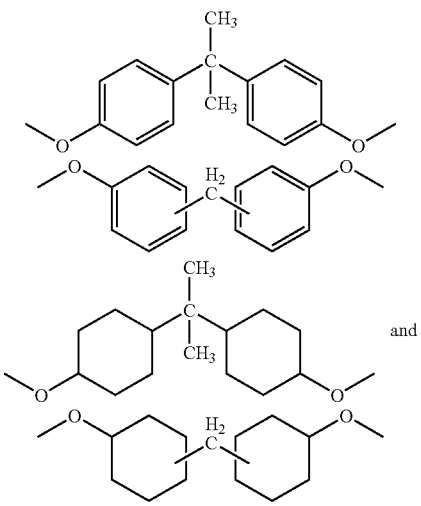

and

Y is at least one organic divalent group selected from the following groups,

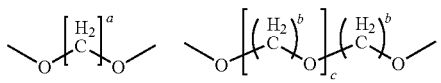

wherein a is an integer of from 1 to 100, b is an integer of from 1 to 6, and c is an integer of from 1 to 40, and

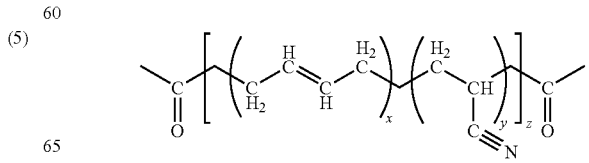

wherein x, y and z are integers of 0 or greater with [y/(x+y)] ranging from 0 to 0.3 and (xz+yz) ranging from 30 to 100, 10 to 1,000 parts by weight of (B) an epoxy resin having at least two glycidyl groups per molecule, and 0.1 to 10 parts by weight of (C) a curing promoter.

8. A method of using the adhesive composition according to claim 6, the method comprising the steps of
(i) applying the adhesive composition on a back side of a wafer,
(ii) heating the applied composition to remove the diluent (D), whereby forming an adhesive layer,
(iii) fixing the wafer on a dicer via the adhesive layer and then cutting the wafer into a plurality of chips,
(iv) picking up one of the chips provided with the adhesive layer bonded on its back side and bonding the chip to a substrate or another chip via the adhesive layer, and
(v) curing the adhesive layer.

9. A semiconductor device comprising a cured adhesion composition, wherein said adhesion composition comprises 100 parts by weight of (A) an alternating copolymer composed of repeating units having alcoholic hydroxyl groups and represented by the following formula (1):

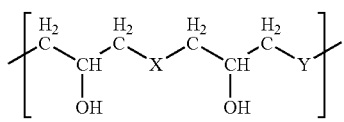 (1)

wherein X is at least one organic divalent group selected from the following groups, and

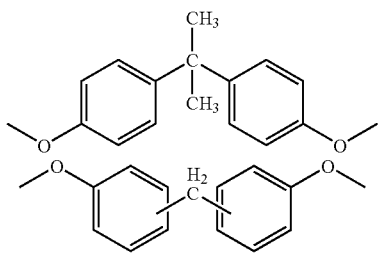

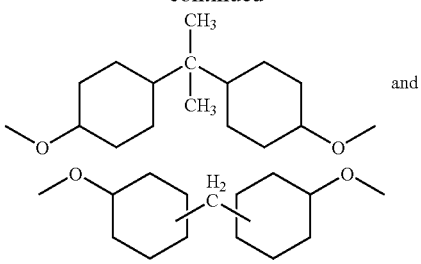

Y is at least one organic divalent group selected from the following groups,

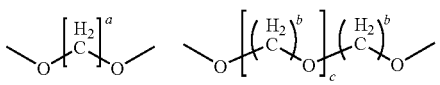

wherein a is an integer of from 1 to 100, b is an integer of from 1 to 6, and c is an integer of from 1 to 40, and

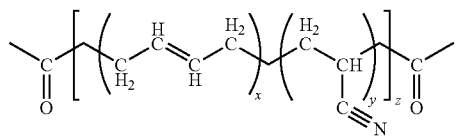

wherein x, y and z are integers of 0 or greater with [y/(x+y)] ranging from 0 to 0.3 and (xz+yz) ranging from 30 to 100, 10 to 1,000 parts by weight of (B) an epoxy resin having at least two glycidyl groups per molecule, 0.1 to 10 parts by weight of (C) a curing promoter, and (D) a diluent selected from the group consisting of isophorone, methyl carbitol, ethyl carbitol, butyl carbitol and carbitol acetate.

* * * * *